United States Patent [19]

Soldner et al.

[11] Patent Number: 5,166,772
[45] Date of Patent: Nov. 24, 1992

[54] TRANSFER MOLDED SEMICONDUCTOR DEVICE PACKAGE WITH INTEGRAL SHIELD

[75] Inventors: Keith D. Soldner; Frank J. Juskey, both of Coral Springs; Bruce J. Freyman; Barry M. Miles, both of Plantation, all of Fla.

[73] Assignee: Motorola, Inc., Schaumburg, Ill.

[21] Appl. No.: 658,810

[22] Filed: Feb. 22, 1991

[51] Int. Cl.⁵ ............................................. H01L 23/28
[52] U.S. Cl. .................. 257/659; 361/424; 174/35 R
[58] Field of Search .............. 357/72, 71, 74, 84, 357/53; 361/424; 174/35 R

[56] References Cited

U.S. PATENT DOCUMENTS

| | | | |
|---|---|---|---|
| 4,177,480 | 12/1979 | Hintzmann et al. | 357/84 |
| 4,661,837 | 4/1987 | Sono | 357/84 |
| 4,675,985 | 6/1987 | Goto | 357/72 |
| 4,680,617 | 7/1987 | Ross | 357/72 |
| 4,967,315 | 10/1990 | Schelhorn | 361/424 |

Primary Examiner—William Mintel
Assistant Examiner—Roy K. Potter
Attorney, Agent, or Firm—Daniel K. Nichols; Dale W. Dorinski

[57] ABSTRACT

A shielded semiconductor package and a method for manufacturing the package is provided. The shielded semiconductor package comprises a substrate (10) having a metallization pattern (12, 13), with one portion of the metallization pattern being a circuit ground (13). A semiconductor device (16) is electrically interconnected (17) to the metallization pattern (12). A perforated metal shield or screen (18) covers the semiconductor device (16) and is electrically and mechanically attached to the metallization circuit ground (13) in order to shield the semiconductor device (16) from radio frequency energy. A resin material (14) is transfer molded about the semiconductor device, the electrical interconnections, and the metal screen to form the completed package.

10 Claims, 3 Drawing Sheets

TRANSFER MOLDED SEMICONDUCTOR DEVICE PACKAGE WITH INTEGRAL SHIELD

CROSS REFERENCES TO RELATED APPLICATIONS

This application is related to U.S. patent application Ser. No. 7/594,480, filed Oct. 9, 1990 which relates to an encapsulated electronic component with a metal shield formed about the component and soldered to the component, and to U.S. patent application Ser. No. 7/620,695 filed on Dec. 3, 1990, which relates to an encapsulated integrated circuit that is further encapsulated with a conductive epoxy material to provide shielding, and also to U.S. patent application Ser. No. 7/650,326, filed on Jan. 31, 1991, which relates to an encapsulated semiconductor device coated with a vacuum deposited metal layer.

TECHNICAL FIELD

This invention relates generally to semiconductor device packages and more specifically to radio frequency shielded semiconductor device packages.

BACKGROUND

Semiconductor device packages or integrated circuit chip carriers find use in a variety of high-density electronics applications. The integrated circuits or semiconductor devices are typically protected from the external environment by transfer molding a thermoset or thermoplastic resin about the device. This package provides protection from dust, humidity and other environmental factors which can destroy the delicate circuitry.

A major problem associated with these types of packages is that they do not provide shielding from radiation, such as radio frequency interference (RFI) or electromagnetic interference (EMI). This ability to shield high-frequency circuits, especially in electronic equipment such as two-way radios, is critical. Conventional shielding systems are generally characterized by a conductive metallic enclosure constructed to surround the device to be shielded. This enclosure acts either to protect the electrical equipment from external RFI or EMI signals or to prevent the escape of RFI or EMI signals generated by the device. Typically, these shielded enclosures are made from a conductive material that is electrically coupled to the surrounding area. In prior art, the shielded enclosures have been made by attaching a drawn metallic casing over the transfer molded package and soldering the metal casing to a substrate connected to the device.

Unfortunately, this method of shielding is extremely sensitive and very costly and cumbersome when used to shield integrated circuits because 1) high temperatures generated during the soldering process for attaching the metal shield to the device, 2) the additional thickness or bulk required when adding a shield, and 3) the additional cost associated with the soldering operation.

Heat generated by the soldering process may be conducted directly to the integrated circuit and can result in damage to the circuit. In order to minimize the damage caused by the soldering operation, due care is required to control the soldering process in order to prevent jeopardizing the quality of the integrated circuit. The increase in the overall size of the shielded package is substantial, due to the additional thickness of the shield. This thickness results in a package that is larger than optimum. The step of soldering the shield also requires additional assembly time and labor, adding further cost to the final package. Providing shielding for integrated circuits in this way requires special mounting and holding fixtures for the shield and the integrated circuit package.

As a result, a need exists for a method to provide RFI shielding to a high-density integrated circuit package that is economical, does not generate excessive temperatures, and provides a low-profile, high-density package.

SUMMARY OF THE INVENTION

Briefly, according to the invention, there is provided a semiconductor device package and a method for manufacturing the package. The semiconductor device package comprises a substrate having a metallization pattern, with one portion of the metallization pattern being a circuit ground. A semiconductor device is electrically interconnected to a first side of the metallization pattern. A perforated metal shield or screen covers the semiconductor device and is electrically and mechanically attached to the metallization circuit ground in order to shield the semiconductor device from radio frequency energy. A resin material is transfer molded about the semiconductor device, the electrical interconnections, and the metal screen to form the completed package.

The method of manufacturing the semiconductor device package comprises the steps of:

1. Providing a substrate comprising a sheet of material having a metallization pattern on at least one side;
2. Mechanically attaching and electrically interconnecting a semiconductor device to the metallization pattern;
3. covering the semiconductor device, the electrical interconnections, and portions of the metallization pattern with a perforated metal shield or screen, and electrically connecting the shield to the metallization pattern ground portion.
4. Transfer molding a material about the semiconductor device so as to encapsulate the semiconductor device, the electrical interconnections, and the metal screen in the material so as to provide an EMI or RFI shield for the semiconductor device.

DETAILED DESCRIPTION OF THE PREFERRED EMBODIMENT

Figure 1:
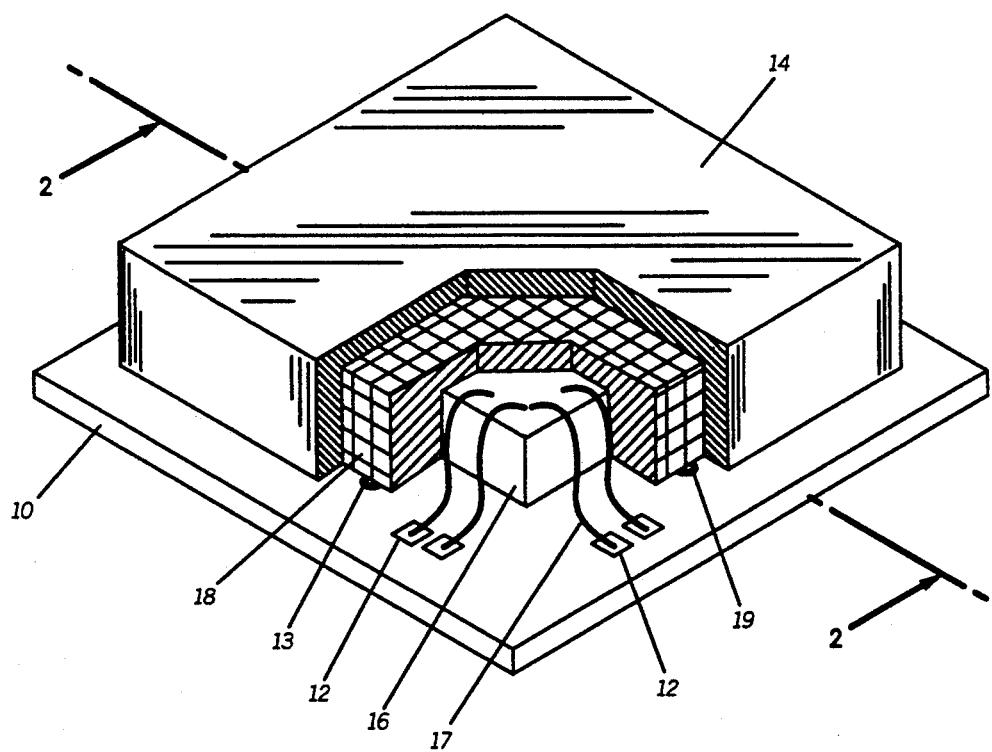
FIG. 1 is an isometric cut-away view of the shielded semiconductor device package in accordance with the present invention.

Referring to FIG. 1, a substrate 10 is provided as a carrier, with a metallization pattern. The substrate material may be any one of a number of materials commonly used in the industry, such as polyester, polyimide, polyetherimide, polytetrafluoroethylene, glass reinforced printed circuit board materials, metal, ceramics, or glass, and may be rigid or flexible. Substrate thickness may vary from approximately 0.001 inches to 0.250 inches, with thicknesses ranging from 0.005 to 0.075 being preferred.

The metallization pattern consists of a conventional die mounting pad (not shown) with wire bond pads 12 arranged around the periphery of the die mount pad. A semiconductor device 16 is mechanically attached to the metallization pattern by means of a conductive adhesive or solder to bond the semiconductor device 16 to the die mounting pad. Nonconductive adhesives may also be utilized if electrical conductivity between the semiconductor device and the die mounting pad is not required. The semiconductor device 16 is then connected to the wire bond pads 12 by wirebonds 17. Other means of connecting semiconductor device 16 to the circuit pattern such as flip-chip bonding or tape-automated bonding (TAB) may be used interchangeably and still fall within the scope of the invention. These attachment methods are common in the industry and are well known to those skilled in the art.

The EMI/RFI shield 18 is added to the package by placing the shield 18 over the semiconductor device 16 and the associated wirebonds 17 and electrical interconnections. The shield 18 may be a metal screen made from copper, nickel, chrome, stainless steel or other alloys, and may be plated with other metals to enhance corrosion resistance, improve solderability, or add to electrical shielding efficiency for example, with gold, tin, lead, indium, palladium, platinum, and alloys of these or other metals. Other form factors for the shield include a perforated metal sheet preformed into the desired shape. The prime requirements for the shield material are that it be conductive, be able to be electrically connected to the circuit ground, and have openings that will permit the transfer molding compounds 14 to pass through the shield 18 to the semiconductor device 16 without unduly restricting the flow of the transfer molding compound 14 during the molding operation. The shield 18 is connected to the ground circuit by forming portions of the shield into legs 19. The legs 19 are connected to the circuit metallization pattern by placing the legs 19 into plated through holes 13 or onto surface mount pads (not shown) of the substrate 10. The legs 19 of the screen 18 are electrically attached to the substrate preferably by use of a conductive adhesive or alternatively by a simple mechanical pressure contact between the legs and a surface mount pad or by reflowing a solder ball or solder paste onto the pad or hole. The electrical attachment may be made prior to the transfer molding operation or after the molding operation.

Figure 2:
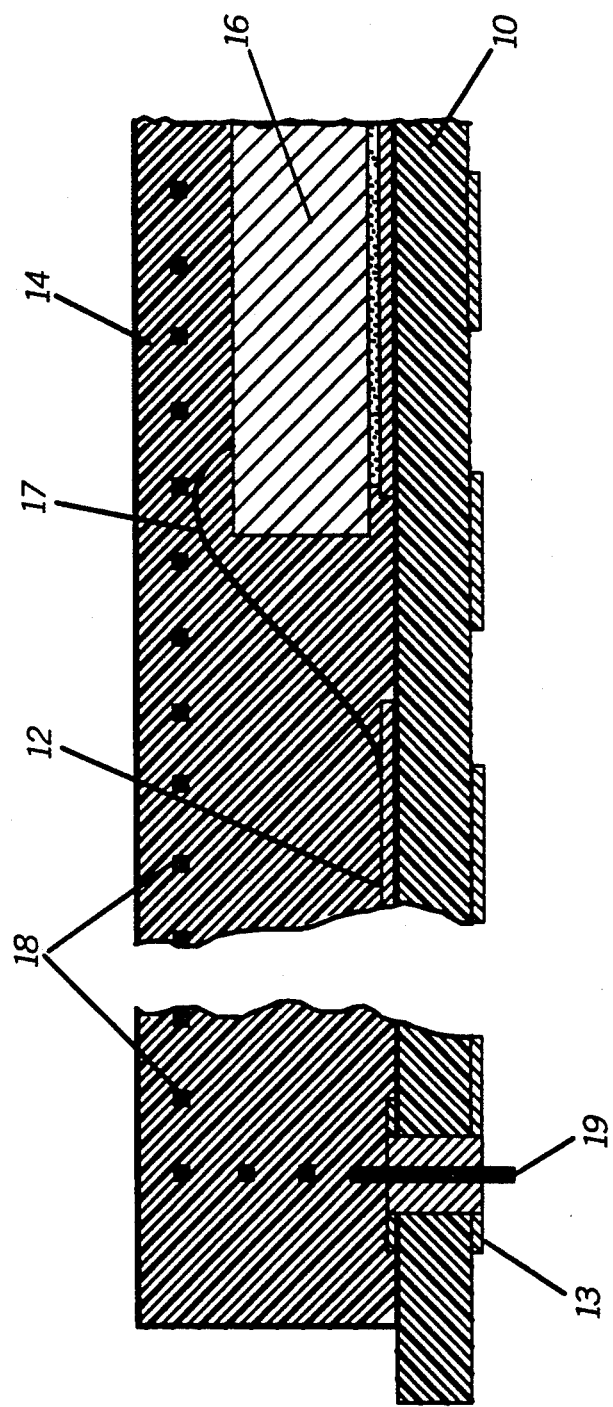
FIG. 2 is a cross-sectional view of the shielded semiconductor device package through section 2—2 of FIG. 1.

The assembly is now encapsulated by placing it into a transfer molding cavity, and transfer molding a thermoplastic or thermoset material about the assembly. During this operation, the molding compound 14 flows through the openings in the metal shield 18 and encapsulates the semiconductor device 16 the same as if the shield 18 were not present. As shown in FIG. 2, the transfer molding compound 14 is on both sides of the metal shield, however the package may be formed such that there is no molding material on the exterior side of the shield, thereby exposing one side of the shield. The perforations or openings in the metal shield serve to allow the molding compound easy passage through the shield in order to form a solid monolithic package.

Figure 3:
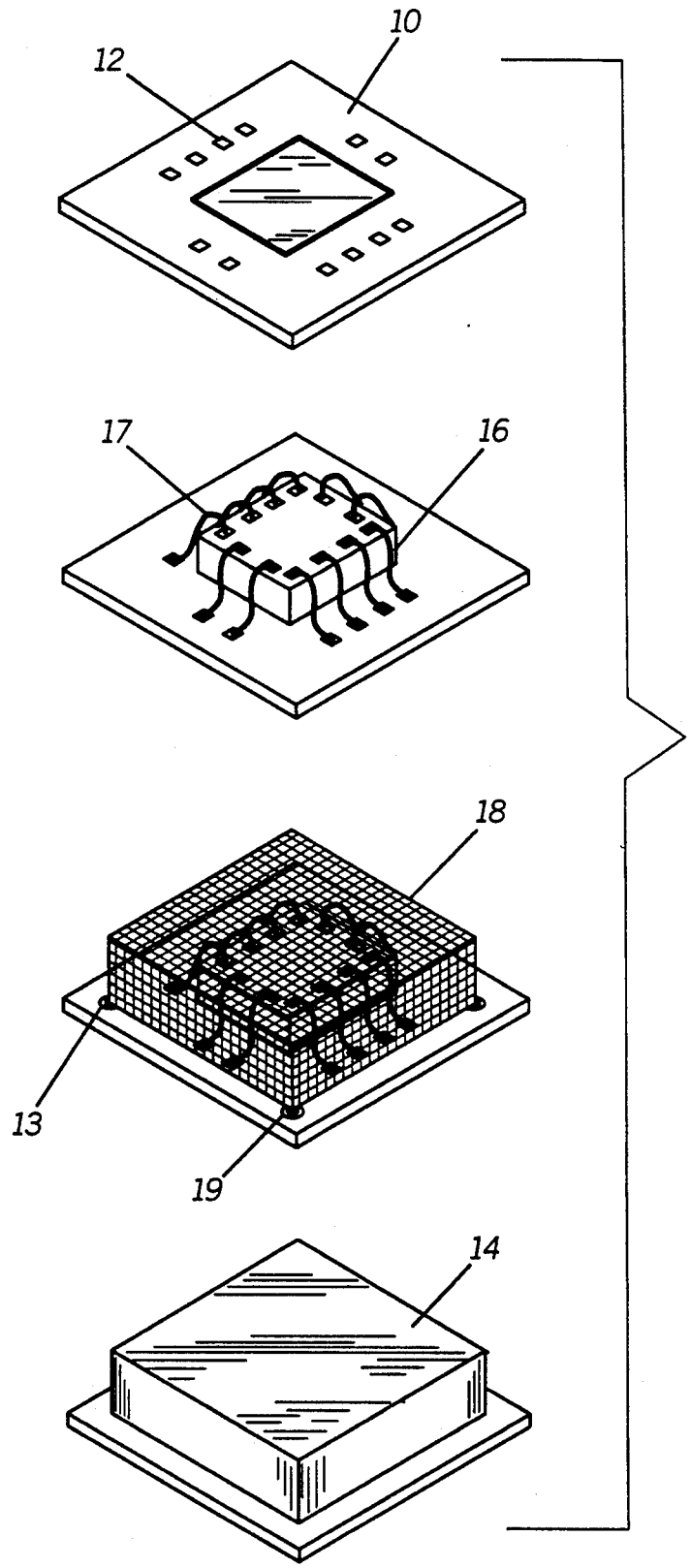
FIG. 3 is a pictorial sequence of the steps involved in manufacturing the shielded semiconductor device package.

Referring now to FIG. 3, a substrate 10 is formed to include a metallization pattern with wire bond pads 12. A semiconductor device 16 is mechanically attached to the substrate 10 and electrically attached to the substrate by means of wire bonds 17, or by flip chip or TAB attachment techniques. The shield 18 is placed over the semiconductor device and associated wirebonds. The shield 18 may consist of a wire mesh of a perforated metal sheet, and may be preformed into the desired shape or formed in place. The edges 19 of the metal shield are connected to the substrate circuit ground by bonding with a conductive adhesive to the circuit ground. In some cases, portions of the shield may be formed into legs and inserted into plated holes 13 in the substrate, but plated holes are not a requirement. The substrate and semiconductor device assembly is encapsulated by transfer molding with a thermoplastic or thermoset transfer molding compound 14 to form a solid mass. The transfer molding compound 14 totally encapsulates the semiconductor device 16, the associated wirebonds 17, the metal shield 18, and portions of the metallization pattern and substrate.

Note that the overall package height is only slightly increased by the shield. Thus the size and cost of the package is reduced when compared to the prior art, and significantly reduced in those cases where complex shields are required. The method of producing semiconductor packages as elucidated in the present invention clearly realizes a number of advantages over the existing prior art by creating a package that is particularly useful in high density electronic applications, such as radios devices. The small size of the package, coupled with the improved shielding capability allow this package to be advantageously employed in applications such as portable radio transmitters, portable telephones, or portable radio receivers.

The examples shown in FIGS. 1-3, while illustrative, are not meant to be considered limiting and other configurations and shapes of the semiconductor package may be envisioned to fall within the scope of the invention.

What is claimed is:

1. A shielded semiconductor device package, comprising:
    an insulating substrate having two opposed sides, a first side having a metallization pattern, one portion of the metallization pattern being a circuit ground, and a second side having a plurality of solderable surface mount pads, the metallization pattern being electrically connected to the surface mount pads by means of at least one conductive via;
    a semiconductor device electrically attached to the metallization pattern and mechanically attached to the substrate;
    a metal screen enclosing the semiconductor device and electrically and mechanically attached to the substrate circuit ground portion to shield the semiconductor device from radio frequency energy; and
    an insulating material transfer molded about the semiconductor device and encapsulating the metal screen.

2. The shielded semiconductor device package according to claim 1, wherein the metal screen comprises a wire mesh.

3. The shielded semiconductor device package according to claim 1, wherein the metal screen comprises a perforated metal sheet.

4. The shielded semiconductor device package according to claim 1, wherein the metal screen is soldered to the circuit ground portion of the metallization pattern.

5. The shielded semiconductor device package according to claim 1, wherein the metal screen is attached to the circuit ground portion of the metallization pattern by means of a conductive epoxy.

6. A shielded semiconductor device package including a radio frequency shield for at least one semiconductor device, comprising:

an insulating substrate having two opposed sides, a first side having a metallization pattern, one portion of the metallization pattern being a circuit ground, and a second side having a plurality of solderable surface mount pads, the metallization pattern being electrically connected to the surface mount pads by means of at least one plated through hole, and having the semiconductor device mechanically attached and electrically interconnected thereto;

a non-conductive material encapsulating the semiconductor device, the electrical interconnections, and portions of the first side of the substrate; and a metal screen enclosing the semiconductor device and covering a portion of the first side of the substrate and electrically coupling the substrate and the metal screen to provide a shield for substantially reducing the ingress or egress of radio frequency signals through the semiconductor device package.

7. The shielded semiconductor device package according to claim 6, wherein the non-conductive material is transfer molded.

8. The shielded semiconductor device package according to claim 7, wherein the metal screen comprises a wire mesh.

9. The shielded semiconductor device package according to claim 6, wherein the metal screen comprises a perforated metal sheet.

10. The shielded semiconductor device package according to claim 6, wherein the metal screen is attached to the circuit ground portion of the metallization pattern by means of a conductive epoxy.

* * * * *